(12) United States Patent
Park et al.

(10) Patent No.: US 11,545,476 B2
(45) Date of Patent: Jan. 3, 2023

(54) DISPLAY DEVICE AND METHOD OF FABRICATING THE SAME

(71) Applicant: Samsung Display Co., Ltd., Yongin-si (KR)

(72) Inventors: Sangjin Park, Yongin-si (KR); Heena Kim, Hwaseong-si (KR); Youngseok Baek, Hwaseong-si (KR); Donghyun Yang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/370,523

(22) Filed: Jul. 8, 2021

(65) Prior Publication Data

US 2021/0335768 A1 Oct. 28, 2021

Related U.S. Application Data

(63) Continuation of application No. 16/673,953, filed on Nov. 4, 2019, now Pat. No. 11,063,030.

(30) Foreign Application Priority Data

Nov. 20, 2018 (KR) .......................... 10-2018-0143736

(51) Int. Cl.
*H01L 25/16* (2006.01)
*H01L 27/12* (2006.01)

(52) U.S. Cl.
CPC .......... *H01L 25/167* (2013.01); *H01L 27/124* (2013.01)

(58) Field of Classification Search
CPC ... H01L 25/167; H01L 27/124; H01L 27/156; H01L 33/62
See application file for complete search history.

(56) References Cited

U.S. PATENT DOCUMENTS

| 10,211,418 | B2 | 2/2019 | Im et al. |
| 10,797,212 | B2 | 10/2020 | Im et al. |
| 2013/0027623 | A1 | 1/2013 | Negishi et al. |
| 2013/0221385 | A1 | 8/2013 | Shibata et al. |
| 2016/0104755 | A1* | 4/2016 | Jin ...................... H01L 27/1222 257/40 |
| 2019/0115513 | A1 | 4/2019 | Im et al. |

FOREIGN PATENT DOCUMENTS

| KR | 10-2015-0098246 | 8/2015 |
| KR | 10-2018-0009015 | 1/2018 |

* cited by examiner

*Primary Examiner* — Allan R Wilson
(74) *Attorney, Agent, or Firm* — Kile Park Reed & Houtteman PLLC

(57) ABSTRACT

A method of fabricating a display device includes forming a circuit layer on a base layer, forming a first preliminary electrode and a second preliminary electrode on the circuit layer, forming a photoresist layer on the first preliminary electrode and the second preliminary electrode, patterning the photoresist layer to form a photoresist pattern, treating a region of each of the first preliminary electrode and the second preliminary electrode to form a first electrode and a second electrode having regions of lower and higher electrical resistance, and disposing a light-emitting element on the first electrode and the second electrode at regions having lower electrical resistance.

20 Claims, 11 Drawing Sheets

DISPLAY DEVICE AND METHOD OF FABRICATING THE SAME

CROSS-REFERENCE TO RELATED APPLICATION(S)

This is a continuation application of U.S. patent application Ser. No. 16/673,953, filed Nov. 4, 2019 (now pending), the disclosure of which is incorporated herein by reference in its entirety. U.S. patent application Ser. No. 16/673,953 claims priority to and benefit of Korean Patent Application No. 10-2018-0143736 under 35 U.S.C. § 119, filed on Nov. 20, 2018 in the Korean Intellectual Property Office, the entire contents of which are incorporated herein by reference.

BACKGROUND

Field

Exemplary implementations of the invention relate generally to a display device and, more specifically, to a display device having light-emitting elements and a method of fabricating the display device.

Discussion of the Background

A display device may include light-emitting elements electrically connected to an electrode and emitting light depending on a voltage applied to the electrode. The light-emitting element may be directly formed on the electrode. Alternatively, the light-emitting element and the electrode may be formed through different processes, and in this case, an additional step should be further performed to align the light-emitting element to the electrode. If the light-emitting element is not properly aligned on the electrode, the light-emitting element may not emit light.

The above information disclosed in this Background section is only for understanding of the background of the inventive concepts, and, therefore, it may contain information that does not constitute prior art.

SUMMARY

Display devices constructed according to the principles and exemplary implementations of the invention and methods of and fabricating the same according to the principles of the invention are capable of providing reliable display devices with high fabrication yields by controlling the arrangement and alignment of light-emitting elements on the electrode. For example, in a display device according to some implementations of the invention, the arrangement position of the light-emitting element is controlled by first electrode and second electrodes of the display, whose electrical resistance varies from region to region. Thus, it may be possible to improve fabrication yield and reliability of the display device.

Additional features of the inventive concepts will be set forth in the description which follows, and in part will be apparent from the description, or may be learned by practice of the inventive concepts.

According to one aspect of the invention, a display device includes a plurality of scan lines and a plurality of data lines; and a plurality of pixels connected with the scan lines and the data lines, wherein at least one pixel of the plurality of pixels includes a pixel circuit having at least one transistor, an insulating layer covering the pixel circuit, a first electrode disposed on the insulating layer and electrically connected to the pixel circuit, the first electrode including at least one first region having a first resistance and a plurality of second regions having a second resistance higher than the first resistance, a second electrode disposed on the insulating layer and spaced apart from the first electrode, the second electrode including at least one third region having a third resistance and a plurality of fourth regions having a fourth resistance higher than the third resistance, and a light-emitting element electrically connected to the first electrode at one of the first regions and the second electrode at one of the third regions.

The plurality of second regions are arranged to be spaced apart from each other in a first direction, and the plurality of fourth regions are arranged to be spaced apart from each other in the first direction.

The first region may include a first electrode center region extending in the first direction, and a plurality of first electrode outer regions protruding from the first electrode center region in a second direction intersecting the first direction. The third region may include a second electrode center region extending in the first direction, and a plurality of second electrode outer regions protruding from the second electrode center region in the second direction.

The plurality of first electrode outer regions and the plurality of second regions may be alternately arranged in the first direction. The plurality of second electrode outer regions and the plurality of fourth regions may be alternately arranged in the first direction.

The plurality of first electrode outer regions may include a first outer region and a second outer region, and the first electrode center region may be disposed between the first outer region and the second outer region.

The light-emitting element may be disposed above or below one of the second regions and one of fourth regions.

The light-emitting element may include a plurality of light-emitting elements having a first end connected to one of the first regions and a second end connected to one of the third regions such that vertically adjacent light-emitting elements are separated from each other in alternating fashion with the second and the fourth regions disposed above and below the light-emitting elements.

The second region and the fourth region may include one of amorphous regions and ionized regions.

The ionized regions may contain oxygen ions. An amount of the oxygen ion contained in the second region may be greater than an amount of the oxygen ion contained in the first region, and an amount of the oxygen ion contained in the fourth region may be greater than an amount of the oxygen ion contained in the third region.

The first region and the third region may include indium tin oxide, and the second region and the fourth region may include indium tin oxide doped with an oxygen ion.

The first region and the third region may include aluminum, and the second region and the fourth region may include aluminum oxide.

According to another aspect of the invention, a method of fabricating a display device, the method includes the steps of: forming a circuit layer on a base layer, forming a first preliminary electrode and a second preliminary electrode on the circuit layer, forming a photoresist layer on the first preliminary electrode and the second preliminary electrode, patterning the photoresist layer to form a photoresist pattern, treating a region of each of the first preliminary electrode and the second preliminary electrode to form a first electrode and a second electrode having regions of lower and higher electrical resistance, and disposing a light-emitting element on the first electrode and the second electrode at regions having lower and electrical resistance.

The first electrode may include a first region and a second region, and the second electrode may include a third region and a fourth region. The second region and the fourth region may be the treated regions.

The first region and the third region may include indium tin oxide, and the second region and the fourth region may include indium tin oxide that is doped with oxygen ions.

The first region and the third region may include aluminum, and the second region and the fourth region may include aluminum oxide.

The second region and the fourth region may be amorphous regions.

The treating step may include injecting an ion into the first preliminary electrode and the second preliminary electrode.

The ion may be an oxygen ion.

The treating step may include injecting nitrogen or argon atoms to the first preliminary electrode and the second preliminary electrode.

The treating step may include injecting plasma to the first preliminary electrode and the second preliminary electrode.

The disposing step may include providing solution, in which the light-emitting element and solvent are contained, on the first electrode and the second electrode, aligning the light-emitting element, and evaporating the solvent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
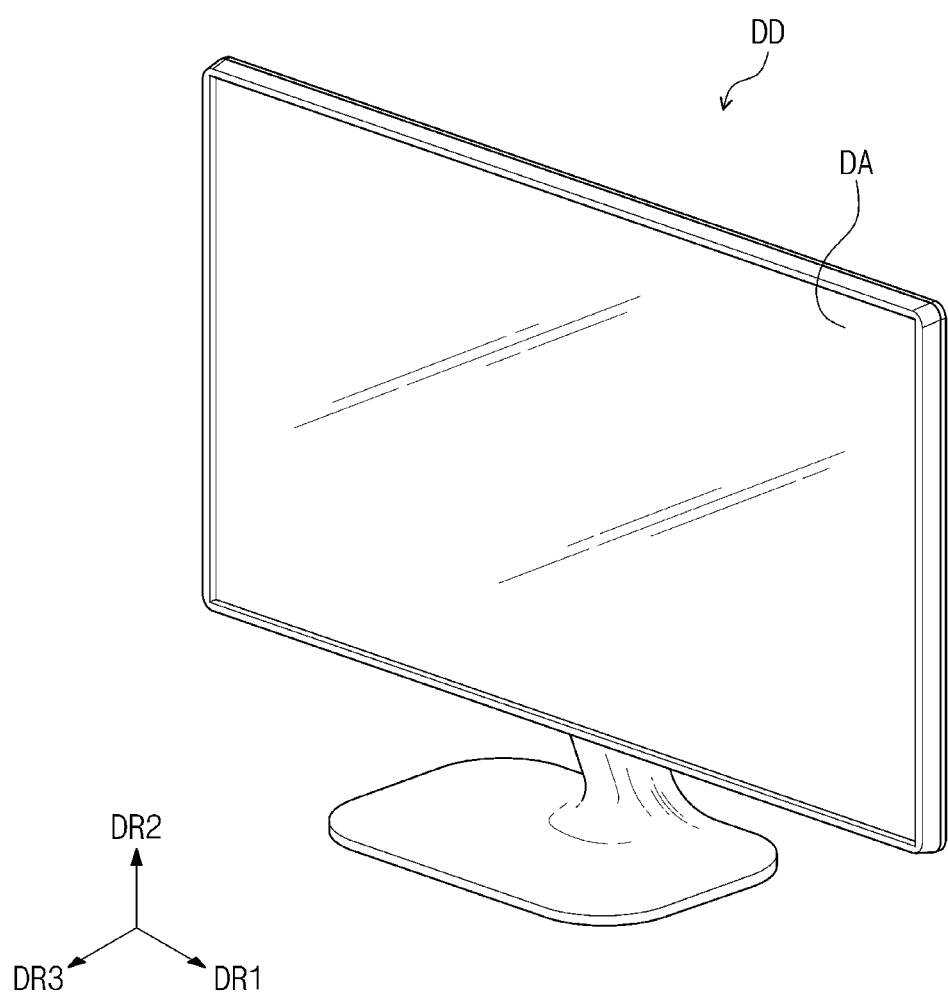
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device constructed according to the principles of the invention.

Referring to FIG. 1, a display device DD may display an image through a display region DA. FIG. 1 illustrates an example, in which the display region DA is disposed to be substantially parallel to a first direction DR1 and a second direction DR2 intersecting the first direction DR1. However, in an exemplary embodiment, the display region DA of the display device DD may be provided on a curved surface.

The thickness direction of the display device DD will be referred to as a third direction DR3. However, directions indicated by the first to third directions DR1, DR2, and DR3 may be relative concepts, and in exemplary embodiments, they may be changed to indicate other directions. In the illustrated exemplary embodiment, the expression "when viewed in a plan view" may be used to describe a shape of an object viewed in the third direction DR3. In addition, the thickness direction may mean the third direction DR3.

FIG. 1 illustrates an example in which the display device DD is a television set. However, the display device DD may be used for large-sized electronic devices (e.g., monitors, and outdoor billboards) or small- or medium-sized electronic devices (e.g., personal computers, notebook computers, personal digital assistants, car navigation systems, game machines, smart phones, tablets, and cameras). However, it should be understood that these are merely exemplary embodiments, and that other electronic devices may be used to realize other exemplary embodiments, consistent the inventive concepts disclosed herein.

Figure 2:
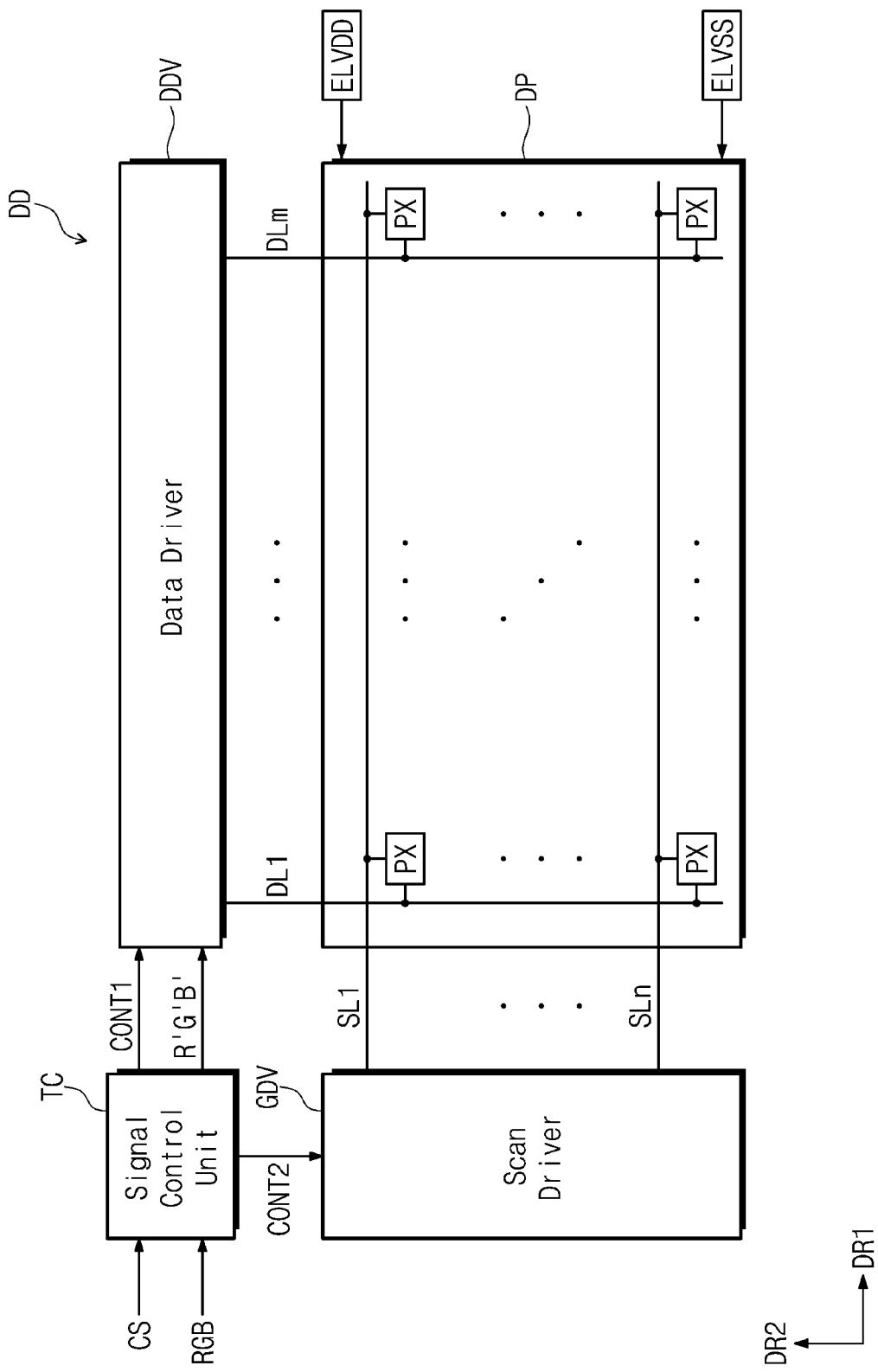
FIG. 2 is a block diagram of an exemplary embodiment of a display device constructed according to the principles of the invention.

FIG. 2 is a block diagram of an exemplary embodiment of a display device constructed according to the principles of the invention.

Referring to FIG. 2, the display device DD may include a display panel DP, a signal control unit or timing controller TC, a data driver DDV, and a scan driver GDV. Each of the signal control unit TC, the data driver DDV, and the scan driver GDV may include a circuit.

The display panel DP may be a display panel including a micro light-emitting element. For example, the display panel DP may be a micro-LED display panel.

The display panel DP may include a plurality of scan lines SL1-SLn, a plurality of data lines DL1-DLm, and a plurality of pixels PX.

The scan lines SL1-SLn may extend in the first direction DR1 and may be arranged in the second direction DR2 crossing the first direction DR1. The data lines DL1-DLm may extend in the second direction DR2 and may be arranged in the first direction DR1.

Each of the pixels PX may include a light-emitting element and a pixel circuit, which is electrically connected to the light-emitting element. The pixel circuit may include a plurality of transistors. A first power voltage ELVDD and a second power voltage ELVSS may be provided to each of the pixels PX.

The pixels PX may be arranged on a surface of the display panel DP, in a regular manner or with a specific arrangement rule. Each of the pixels PX may display one of primary colors or one of mixed colors. The primary colors may include red, green, and blue, and the mixed colors may include various colors, such as yellow, cyan, magenta, and white. However, colors, which can be displayed by the pixels PX, are not limited to the above colors.

The signal control unit TC may receive image data RGB provided from the outside. The signal control unit TC may convert the image data RGB to image data R'G'B', which are suitable for operations of the display panel DP, and then may output the converted image data R'G'B' to the data driver DDV.

The signal control unit TC may receive a control signal CS provided from the outside. The control signal CS may include a vertical synchronization signal, a horizontal synchronization signal, a main clock signal, and a data enable signal, or the like. The signal control unit TC may provide a first control signal CONT1 to the data driver DDV and may provide a second control signal CONT2 to the scan driver GDV. The first control signal CONT1 may be a signal for controlling the data driver DDV, and the second control signal CONT2 may be a signal for controlling the scan driver GDV.

The data driver DDV may provide electric signals to the data lines DL1-DLm, in response to the first control signal CONT1 from the signal control unit TC. The data driver DDV may be implemented as a separate integrated circuit and may be electrically connected to a side region of the display panel DP. In an exemplary embodiment, the data driver DDV may be directly mounted on the display panel DP. The data driver DDV may be provided in the form of a single chip or may include a plurality of chips.

The scan driver GDV may provide electrical signals to the scan lines SL1-SLn, in response to the second control signal CONT2 received from the signal control unit TC. The scan driver GDV may be integrated on a specific region of the display panel DP. For example, the scan driver GDV may include a plurality of thin-film transistors that are formed by the same process as that for the driving circuit of the pixel PX (e.g., by a low temperature polycrystalline silicon (LTPS) process or a low temperature polycrystalline oxide (LTPO) process). In an exemplary embodiment, the scan driver GDV may be implemented as a separate integrated circuit chip and may be electrically connected to a portion of the display panel DP.

While one of the scan lines SL1-SLn is applied with a gate-on voltage, a switching transistor of each pixel in a row of pixels connected thereto may be turned on. Here, the data driver DDV may provide data driving signals to the data lines DL1-DLm. The data driving signals provided to the data lines DL1-DLm may be respectively applied to corresponding pixels through the turned-on switching transistors. The data driving signals may be analog voltages corresponding to gradation levels of the image data.

Figure 3:
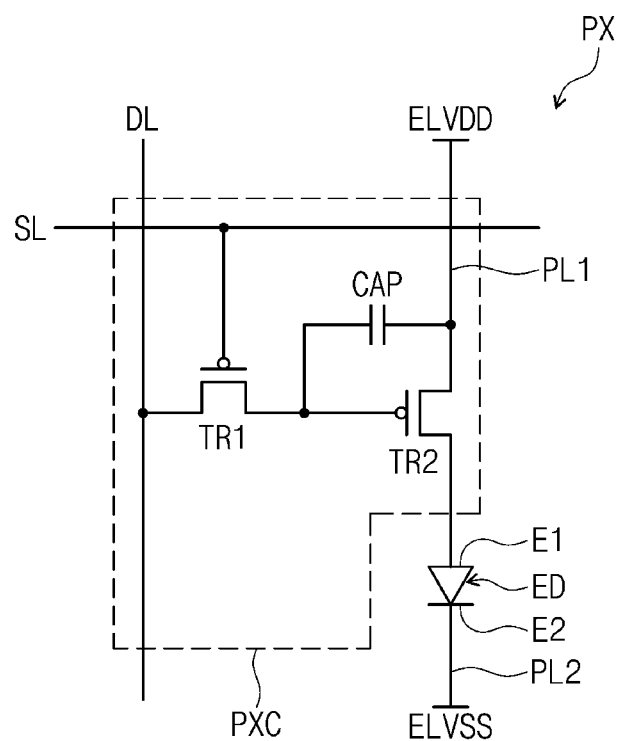
FIG. 3 is an equivalent circuit diagram of a representative pixel of the display device of FIG. 2

FIG. 3 is an equivalent circuit diagram of a representative pixel of the display device of FIG. 2. FIG. 3 illustrates an equivalent circuit diagram for one of a plurality of the pixels PX shown in FIG. 2.

Referring to FIG. 3, the pixel PX may be electrically connected to a plurality of signal lines. In the illustrated exemplary embodiment, some (e.g., a scan line SL, a data line DL, a first power line PL1, and a second power line PL2) of the signal lines are exemplarily illustrated. However, the exemplary embodiments are not limited to this illustrated exemplary embodiment, and in an exemplary embodiment, the pixel PX may be further connected to various other signal lines.

The pixel PX may include a light-emitting element ED, a first electrode E1, a second electrode E2, and a pixel circuit PXC. The pixel circuit PXC may include a first thin film transistor TR1, a capacitor CAP, and a second thin film transistor TR2. However, this is just an example, and the numbers of the thin film transistor and the capacitor constituting the pixel circuit PXC are not limited to those shown in FIG. 3. For example, in an exemplary embodiment, the pixel circuit PXC may include seven thin film transistors and one capacitor.

The first thin film transistor TR1 may be a switching transistor configured to control the on/off operation of the pixel PX. The first thin film transistor TR1 may transmit or block a data signal transmitted through the data line DL, in response to a scan signal to be transmitted through the scan line SL.

The capacitor CAP may be connected to the first thin film transistor TR1 and the first power line PL1. The capacitor CAP may be used to store electric charges, and an amount of the electric charges stored in the capacitor CAP may be determined by a voltage difference between the data signal transmitted from the first thin film transistor TR1 and the first power voltage ELVDD applied to the first power line PL1.

The second thin film transistor TR2 may be connected to the first thin film transistor TR1, the capacitor CAP, and the light-emitting element ED. The second thin film transistor TR2 may control a driving current flowing through the light-emitting element ED in accordance with an amount of charges stored in the capacitor CAP. The turn-on time of the second thin film transistor TR2 may be determined depending on the amount of charges stored in the capacitor CAP.

The first thin film transistor TR1 and the second thin film transistor TR2 may be n-type thin film transistors or p-type thin film transistors. In an exemplary embodiment, at least one of the first thin film transistor TR1 and the second thin film transistor TR2 may be an n-type thin film transistor, and the other may be a p-type thin film transistor.

The light-emitting element ED may be connected to the second thin film transistor TR2 and the second power line PL2. For example, the light-emitting element ED may be connected to the first electrode E1, which is electrically connected to the second thin film transistor TR2, and the second electrode E2, which is connected to the second power line PL2. The first electrode E1 may be electrically connected to the pixel circuit PXC, and the second electrode E2 may receive a power voltage (e.g., the second power voltage ELVSS) through the second power line PL2.

The light-emitting element ED may emit light, and here, an intensity of the emitted light may be determined by a voltage different between the signal, which is transferred through the second thin film transistor TR2, and the second power voltage ELVSS, which is received through the second power line PL2.

The light-emitting element ED may be a micro-LED element. The micro-LED element may be an LED element whose length ranges from several nanometers to several hundred micrometers. However, the length of the micro-LED element is not limited to the above example or a specific range.

An example, in which the light-emitting element ED is solely connected between the second thin film transistor TR2 and the second power line PL2, is illustrated in FIG. 3, but, in an exemplary embodiment, a plurality of the light-emitting elements ED may be provided. The plurality of the light-emitting elements ED may be connected in parallel to each other.

Figure 4A:
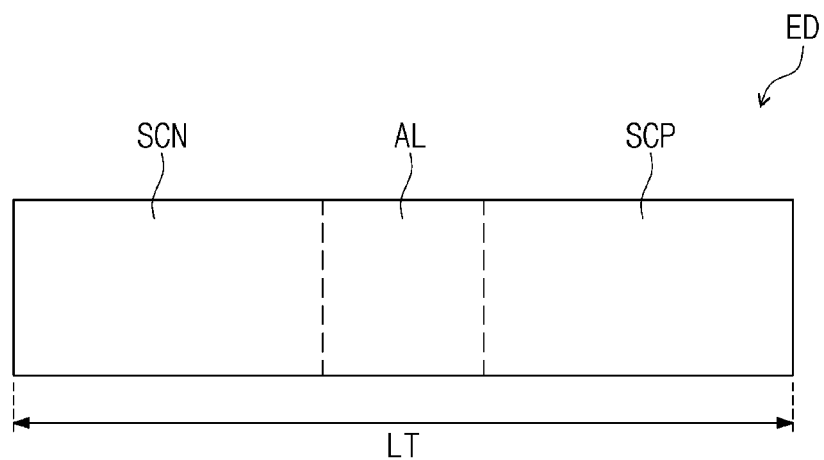
FIG. 4A is an enlarged sectional view of a first exemplary embodiment of a light-emitting element of FIG. 3.
Figure 4B:
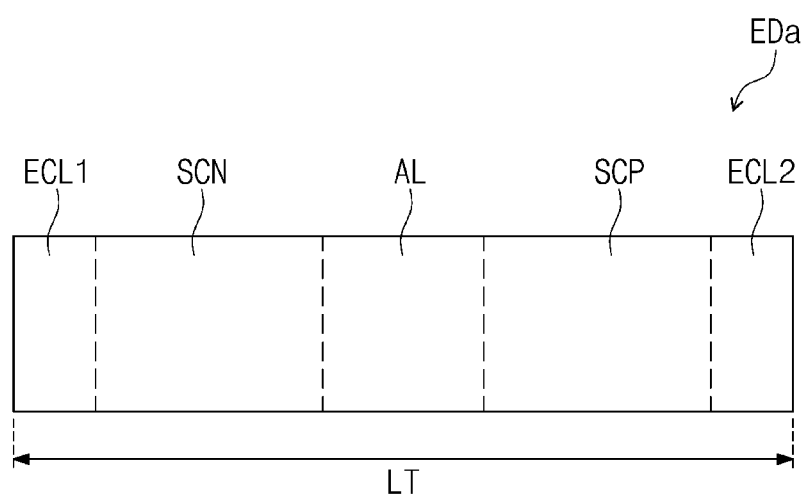
FIG. 4B is an enlarged sectional view of a second exemplary embodiment of a light-emitting element of FIG. 3.
Figure 4C:
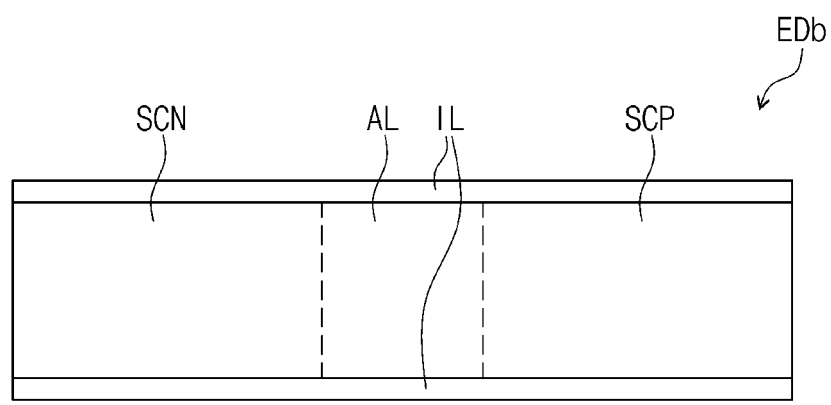
FIG. 4C is an enlarged sectional view of a third exemplary embodiment of a light-emitting element of FIG. 3.
Figure 4D:
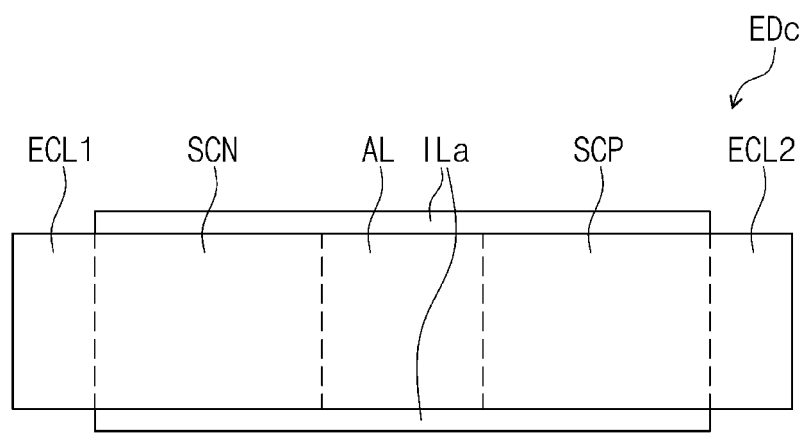
FIG. 4D is an enlarged sectional view of a fourth exemplary embodiment of a light-emitting element of FIG. 3.
Figure 5:
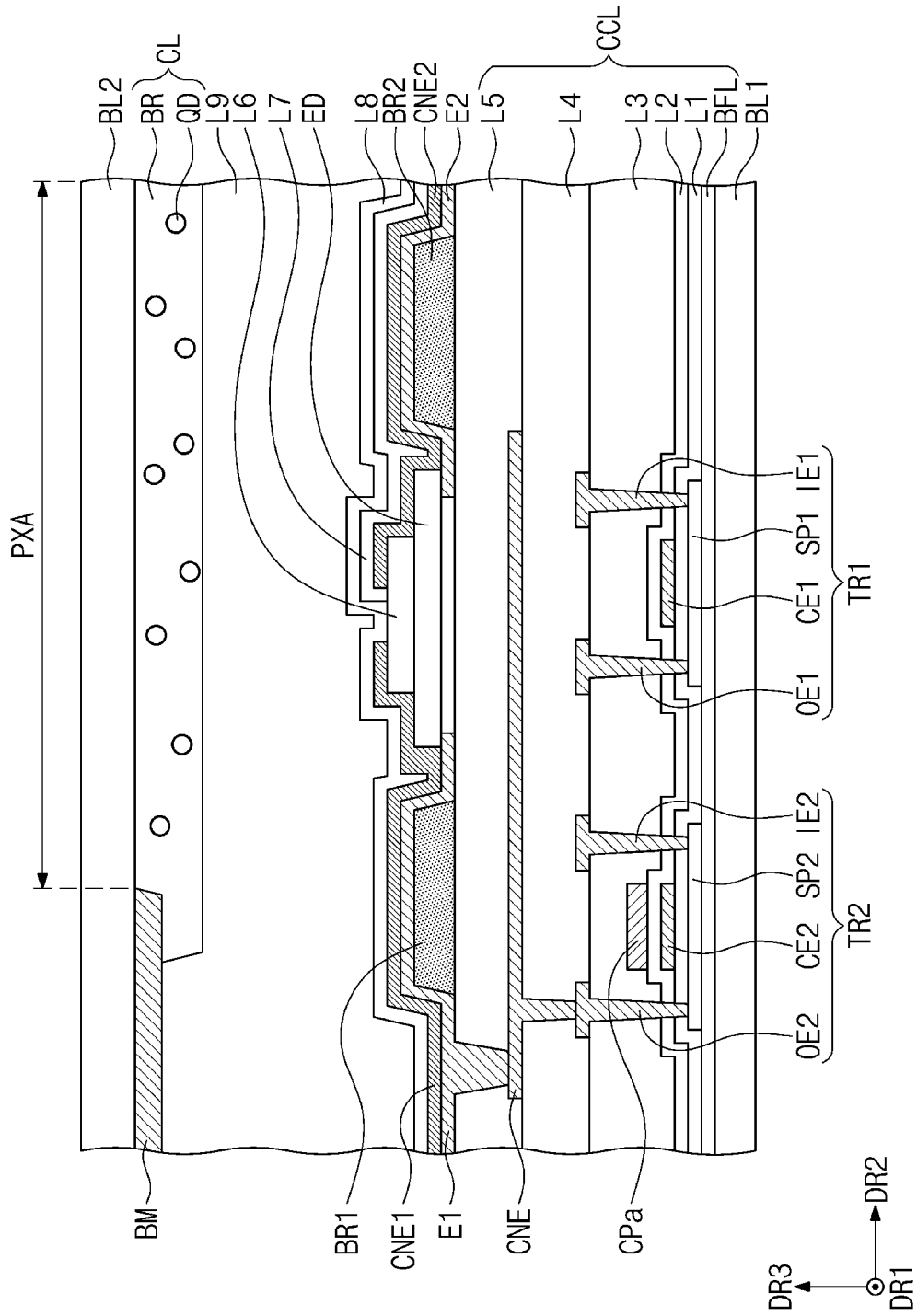
FIG. 5 is a sectional view of an exemplary embodiment of a display panel constructed according to the principles of the invention.

FIGS. 4A to 4D are enlarged, sectional views illustrate exemplary embodiments of a light-emitting element of FIG. 3 and FIG. 5 is a sectional view illustrates an exemplary embodiment of a display panel constructed according to the principles of the invention.

FIG. 4A is an enlarged sectional view of a first exemplary embodiment of a light-emitting element of FIG. 3.

The light-emitting element ED may have various shapes including a circular pillar-type shape or a polygonal pillar-type shape. FIG. 4A illustrates a section of the light-emitting element ED.

Referring to FIG. 4A, the light-emitting element ED may include an n-type semiconductor layer SCN, a p-type semiconductor layer SCP, and an active layer AL. The active layer AL may be disposed between the n-type semiconductor layer SCN and the p-type semiconductor layer SCP.

The n-type semiconductor layer SCN may be provided by doping a semiconductor layer with n-type dopants, and the p-type semiconductor layer SCP may be provided by doping a semiconductor layer with p-type dopants. The semiconductor layer may include a semiconductor material, which may be at least one of, for example, GaN, AlN, AlGaN, InGaN, InN, InAlGaN, or AlInN, however, the exemplary embodiments are not limited to this example. The n-type dopants may be at least one of silicon (Si), germanium (Ge), tin (Sn), selenium (Se), tellurium (Te), but the exemplary embodiments are not limited to this example. The p-type dopants may be at least one of magnesium (Mg), zinc (Zn), calcium (Ca), strontium (Sr), or barium (Ba), but the exemplary embodiments are not limited to this example.

The active layer AL may be formed to have at least one of a single quantum well structure, a multiple quantum well structure, a quantum rod structure, or a quantum dot structure. The active layer AL may be a region, in which electrons injected through the n-type semiconductor layer SCN are recombined with holes injected through the p-type semiconductor layer SCP. The active layer AL may be a layer emitting light, whose energy is determined by an energy band of a material. The position of the active layer AL may be variously changed, depending on the kind of the diode.

The n-type semiconductor layer SCN may be coupled to one of the first electrode E1 and the second electrode E2 (e.g., see FIG. 5), and the p-type semiconductor layer SCP may be coupled to the other of the first electrode E1 and the second electrode E2.

A length LT of the light-emitting element ED may range from several nanometers to several hundred micrometers. For example, the length LT of the light-emitting element ED may range from 1 micrometer to 100 micrometers.

FIG. 4B is an enlarged sectional view of a second exemplary embodiment of a light-emitting element of FIG. 3.

Referring to FIG. 4B, a light-emitting element EDa may further include a first electrode layer ECL1 and a second electrode layer ECL2, when compared with the light-emitting element ED of FIG. 4A.

The first electrode layer ECL1 may be adjacent to the n-type semiconductor layer SCN, and the second electrode layer ECL2 may be adjacent to the p-type semiconductor layer SCP. In an exemplary embodiment, the first electrode layer ECL1, the n-type semiconductor layer SCN, the active layer AL, the p-type semiconductor layer SCP, and the second electrode layer ECL2 may be sequentially stacked.

Each of the first electrode layer ECL1 and the second electrode layer ECL2 may be formed of or include at least one of metallic materials or metal alloys. For example, each of the first electrode layer ECL1 and the second electrode layer ECL2 may be formed of a metallic material, which is selected from molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh), and iridium (Ir), or an alloy containing at least one of the metallic elements. The first electrode layer ECL1 and the second electrode layer ECL2 may include the same material, but in an exemplary embodiment, the first electrode layer ECL1 and the second electrode layer ECL2 may include different materials from each other.

FIG. 4C is an enlarged sectional view of a third exemplary embodiment a light-emitting element of FIG. 3.

Referring to FIG. 4C, a light-emitting element EDb may further include an insulating layer IL, when compared with the light-emitting element ED of FIG. 4A. For example, the light-emitting element EDb may have a core-shell structure.

The insulating layer IL may cover the n-type semiconductor layer SCN, the p-type semiconductor layer SCP, and the active layer AL and may protect outer surfaces of the n-type semiconductor layer SCN, the p-type semiconductor layer SCP, and the active layer AL. In an exemplary embodiment, the insulating layer IL may be locally disposed to cover the active layer AL, but not the n-type semiconductor layer SCN and the p-type semiconductor layer SCP.

FIG. 4D is an enlarged sectional view of a third exemplary embodiment a light-emitting element-of FIG. 3.

Referring to FIG. 4D, a light-emitting element EDc may further include an insulating layer ILa, when compared with the light-emitting element EDa of FIG. 4B.

The insulating layer ILa may cover the n-type semiconductor layer SCN, the p-type semiconductor layer SCP, and the active layer AL but not cover a first electrode EL1 and a second electrode EL2. In an exemplary embodiment, the insulating layer ILa may cover at least a portion of the first electrode EL1 and the second electrode EL2 or may cover both of the first electrode EL1 and the second electrode EL2.

FIG. 5 is a sectional view of an exemplary embodiment of a display panel constructed according to the principles of the invention. For convenience in illustration, FIG. 5 illustrates a region corresponding to a single pixel, and some elements are omitted from FIG. 5.

Referring to FIG. 5, a first base layer BL1 and a second base layer BL2 may be disposed to face each other. Each of the first base layer BL1 and the second base layer BL2 may be a silicon substrate, a plastic substrate, a glass substrate, an insulating film, or a stack including a plurality of insulating layer.

A circuit layer CCL may be disposed on the first base layer BL1. The circuit layer CCL may include a stacking structure including a plurality of insulating layers, a plurality of transistors, and a plurality of electrodes. For example, the circuit layer CCL may include a buffer layer BFL, a first insulating layer L1, the first thin film transistor TR1, the second thin film transistor TR2, a second insulating layer L2, a third insulating layer L3, a fourth insulating layer L4, a connection electrode CNE, and a fifth insulating layer L5.

The buffer layer BFL may be disposed on the first base layer BL1. The first thin film transistor TR1 and the second thin film transistor TR2 may be disposed on the buffer layer BFL.

The first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first semiconductor pattern SP1 and the second semiconductor pattern SP2 may be disposed on the buffer layer BFL. The buffer layer BFL may provide a reformed surface to the first semiconductor pattern SP1 and the second semiconductor pattern SP2. In this case, the first semiconductor pattern SP1 and the second semiconductor pattern SP2 may have an increased adhesion strength to the buffer layer BFL, compared to the case that they are directly formed on the first base layer BL1. In an embodiment, the buffer layer BFL may be a barrier layer protecting a bottom surface of each of the first semiconductor pattern SP1 and the second semiconductor pattern SP2. In this case, the buffer layer BFL may prevent contamination material or moisture, which are supplied from or through the first base layer BL1, from entering the first semiconductor pattern SP1 and the second semiconductor pattern SP2.

The first insulating layer L1 may be disposed on the buffer layer BFL to cover the first semiconductor pattern SP1 and the second semiconductor pattern SP2. The first insulating layer L1 may include an inorganic material. The inorganic material may be, for example, silicon nitride, silicon oxynitride, silicon oxide, titanium oxide, or aluminum oxide, but the exemplary embodiments are not limited to this example.

The first control electrode CE1 and the second control electrode CE2 may be provided on the first insulating layer L1. The second insulating layer L2 may be disposed on the first insulating layer L1 to cover the first control electrode CE1 and the second control electrode CE2. The second insulating layer L2 may include an inorganic material.

The capacitor CAP (e.g., see FIG. 3) may include a first cap electrode and a second cap electrode CPa. For example, the first cap electrode may be a portion, which is divided from the second control electrode CE2, and the second cap electrode CPa may be disposed on the second insulating layer L2.

The third insulating layer L3 may be disposed on the second insulating layer L2 to cover the second cap electrode CPa. The first input electrode IE1, the first output electrode OE1, the second input electrode IE2, and the second output electrode OE2 may be disposed on the third insulating layer L3. The first input electrode IE1 and the first output electrode OE1 may be connected to the first semiconductor pattern SP1 through penetration holes penetrating the first to third insulating layers L1, L2, and L3. The second input electrode IE2 and the second output electrode OE2 may be connected to the second semiconductor pattern SP2 through penetration holes penetrating the first to third insulating layers L1, L2, and L3. Not only the first input electrode IE1, the first output electrode OE1, the second input electrode IE2, and the second output electrode OE2 but also at least a portion of each of signal lines (e.g., scan or data lines) may be disposed on the third insulating layer L3.

The fourth insulating layer L4 may be disposed on the third insulating layer L3 to cover the first input electrode IE1, the first output electrode OE1, the second input electrode IE2, and the second output electrode OE2. The fourth insulating layer L4 may have a single- or multi-layered structure, and the fourth insulating layer L4 may be formed of or include an organic material and/or an inorganic material.

The connection electrode CNE may be disposed on the fourth insulating layer L4. Not only the connection electrode CNE but also at least a portion of each of the signal lines (e.g., the scan or data lines) may be disposed on the fourth insulating layer L4. The connection electrode CNE may be connected to the second output electrode OE2.

The fifth insulating layer L5 may be disposed on the fourth insulating layer L4 to cover the connection electrode CNE. The fifth insulating layer L5 may include an organic material. The fifth insulating layer L5 may cover the pixel circuit PXC (e.g., see FIG. 3), which is disposed therebelow, and may provide a substantially flat surface.

A first partition wall BR1 and a second partition wall BR2 may be disposed on the fifth insulating layer L5. Each of the first partition wall BR1 and the second partition wall BR2 may extend in the first direction DR1. The second partition wall BR2 may be spaced apart from the first partition wall BR1 in the second direction DR2. The first partition wall BR1 and the second partition wall BR2 may be formed of or include the same material. For example, the first partition wall BR1 and the second partition wall BR2 may be formed of or include an organic material.

The first electrode E1 may be disposed on the first partition wall BR1, and the second electrode E2 may be disposed on the second partition wall BR2. The first electrode E1 may extend in the first direction DR1 and may cover the first partition wall BR1, and the second electrode E2 may extend in the first direction DR1 and may cover the second partition wall BR2. In other words, the first partition wall BR1 may be disposed between the first electrode E1 and the fifth insulating layer L5, and the second partition wall BR2 may be disposed between the second electrode E2 and the fifth insulating layer L5.

In the fifth insulating layer L5, a penetration hole may be provided to expose the connection electrode CNE. The first electrode E1 may be electrically connected to the exposed connection electrode CNE. The second electrode E2 may be electrically connected to the second power line PL2 (e.g., see FIG. 3). In other words, the second power voltage ELVSS (e.g., FIG. 3) may be provided to the second electrode E2.

Each of the first electrode E1 and the second electrode E2 may have a single-layered structure or a stacking structure including a plurality of layers. For example, each of the first electrode E1 and the second electrode E2 may include a reflection electrode and a capping electrode, which is disposed on the reflection electrode. The reflection electrode may have a single-layered structure or a stacked structure including a plurality of layers. For example, the reflection electrode may have a stacking structure, in which indium tin oxide (ITO), silver (Ag), and indium tin oxide (ITO) layers are sequentially stacked. However, the exemplary embodiments are not limited to this example. The capping electrode may encapsulate the reflection electrode. The capping electrode may include at least one indium zinc oxide (IZO), indium tin oxide (ITO), indium gallium oxide (IGO), indium zinc gallium oxide (IGZO), mixtures thereof, or compounds thereof.

The light-emitting element ED may be disposed on the fifth insulating layer L5. In an exemplary embodiment, a plurality of the light-emitting elements ED may be provided and may be connected in parallel. An insulating pattern may be further disposed between the fifth insulating layer L5 and the light-emitting element ED. The light-emitting element ED may be electrically connected to the first electrode E1 and the second electrode E2.

A sixth insulating layer L6 or an insulating pattern may be disposed on the light-emitting element ED. The sixth insulating layer L6 may cover at least a portion of a top surface of the light-emitting element ED.

The light-emitting element ED may be electrically connected to the first electrode E1 via a first connection electrode CNE1, and the light-emitting element ED may be electrically connected to the second electrode E2 via a second connection electrode CNE2.

The second connection electrode CNE2 may be disposed on the light-emitting element ED and the second electrode E2. For example, the second connection electrode CNE2 may overlap some portions of the light-emitting element ED and the second electrode E2 as shown in FIG. 5. A seventh insulating layer L7 may be disposed on the second connection electrode CNE2. The first connection electrode CNE1 may be disposed on the light-emitting element ED and the first electrode E1. For example, the first connection electrode CNE1 may overlap some portions of the light-emitting element ED and the first electrode E1 as shown in FIG. 5. Even when the length of the light-emitting element ED is shorter than several hundred micrometers, the second connection electrode CNE2 and the first connection electrode CNE1 may not be in direct contact with each other by the seventh insulating layer L7. However the exemplary embodiments are not limited to this example, and in an exemplary embodiment, the first connection electrode CNE1 and the second connection electrode CNE2 may be simultaneously formed through the same process. In this case, the seventh insulating layer L7 may be omitted.

Each of the first connection electrode CNE1 and the second connection electrode CNE2 may include a conductive material. For example, the conductive material may include at least one of indium zinc oxide (IZO), indium tin oxide (ITO), indium gallium oxide (IGO), indium zinc gallium oxide (IGZO), mixtures thereof, or compounds thereof. However, the exemplary embodiments are not limited to example. For example, the conductive material may be a metallic material, which includes, for example, molybdenum (Mo), silver (Ag), titanium (Ti), copper (Cu), aluminum (Al), or alloys thereof.

An eighth insulating layer L8 may be disposed on the first connection electrode CNE1 and the seventh insulating layer L7. The eighth insulating layer L8 may be an encapsulation layer.

A light-blocking layer BM may be disposed on a surface of the second base layer BL2 facing the first base layer BL1. An opening may be provided in the light-blocking layer BM, and a wavelength conversion part CL may cover the opening. A region exposed by the opening may correspond to a pixel light-emitting region PXA.

The wavelength conversion part CL may include a resin BR and a light emitter QD. The resin BR may be a medium material, in which the light emitter QD is dispersed, and may be made of at least one of various resin composites, which are in general called "binder". However, the exemplary embodiments are not limited to this example, and in the illustrated exemplary embodiment, if the light emitter QD can be dispersed in a medium material, such a medium material may be referred to as a base resin, regardless of its name, additional function, or constituents. The base resin may be a polymer resin. For example, the base resin may be acrylic resins, urethane resins, silicone resins, and/or epoxy resins. The base resin may be transparent.

The light emitter QD may absorb a first light provided from the light-emitting element ED and may emit a second color light, whose color or wavelength is converted to be different from that of the first light. The light emitter QD may be, for example, quantum dots. The first light may be a blue light, and the second color light may be a green or red light.

Each of the quantum dots may have a nanometer-order crystalline material consisting of hundreds to thousands of atoms, and due to its small size, the quantum dots may exhibit an increase in band gap caused by the quantum confinement effect. In the case where an energy of light incident to the quantum dots is larger than a band gap of each of the quantum dots, each of the quantum dots may absorb the light to be in an excited state, and then, may emit light of a specific wavelength, while returning to its ground state. The wavelength of the emitted light may be determined by the band gap. That is, by adjusting sizes or compositions of the quantum dots, it may be possible to control the quantum confinement effect and light-emitting characteristics of the light emitter QD.

The quantum dots may be a core-shell structure including a core and a shell enclosing the core. In an exemplary embodiment, the quantum dots may have a core/shell structure, in which one quantum dot is enclosed by another quantum dot. At an interface between the core and the shell, an element contained in the shell may have a concentration gradient decreasing in a central direction.

Each of the quantum dots may be a nanometer-scale particle. Each of the quantum dots may have a light-emitting wavelength spectrum whose full width half maximum (FWHM) is less than about 45 nm (in particular, less than about 40 nm or in more particular, less than about 30 nm), and in this case, it may be possible to realize improved color purity or color reproduction characteristics. Furthermore, the quantum dots may allow light to be emitted radially, and thus, it may be possible to improve a viewing angle property.

In an exemplary embodiment, the quantum dots may be a spherical, pyramid-shaped, multi-arm, or cubic nano particle. In another exemplary embodiment, the quantum dots may be a nano tube, a nano wire, a nano fiber, a nano plate-shaped particle, but the exemplary embodiments are not limited to these examples.

In an exemplary embodiment, the wavelength conversion part CL may be replaced with a color filter. The color filter may absorb light of a specific wavelength to realize a desired color. In an exemplary embodiment, the wavelength conversion part CL may be omitted. In this case, the light-emitting element ED may emit a blue, green, or red light. In an exemplary embodiment, the display device DD may further include a color filter layer disposed between the wavelength conversion part CL and the second base layer BL2.

A ninth insulating layer L9 may be disposed between the wavelength conversion part CL and the eighth insulating layer L8. For example, the ninth insulating layer L9 may be used to combine or bond the first base layer BL1, in which the pixel circuit PXC (e.g., see FIG. 3) and the light-emitting element ED are disposed, to the second base layer BL2, in which the wavelength conversion part CL and the light-blocking layer BM are disposed. For example, the ninth insulating layer 19 may be a filler, an optically clear adhesive film, an optically clear resin, or a pressure sensitive adhesive film. However, the exemplary embodiments are not limited to example, and in an exemplary embodiment, the ninth insulating layer L9 may be omitted. In this case, a cell gap may be provided between the wavelength conversion part CL and the eighth insulating layer L8.

Figure 6A:
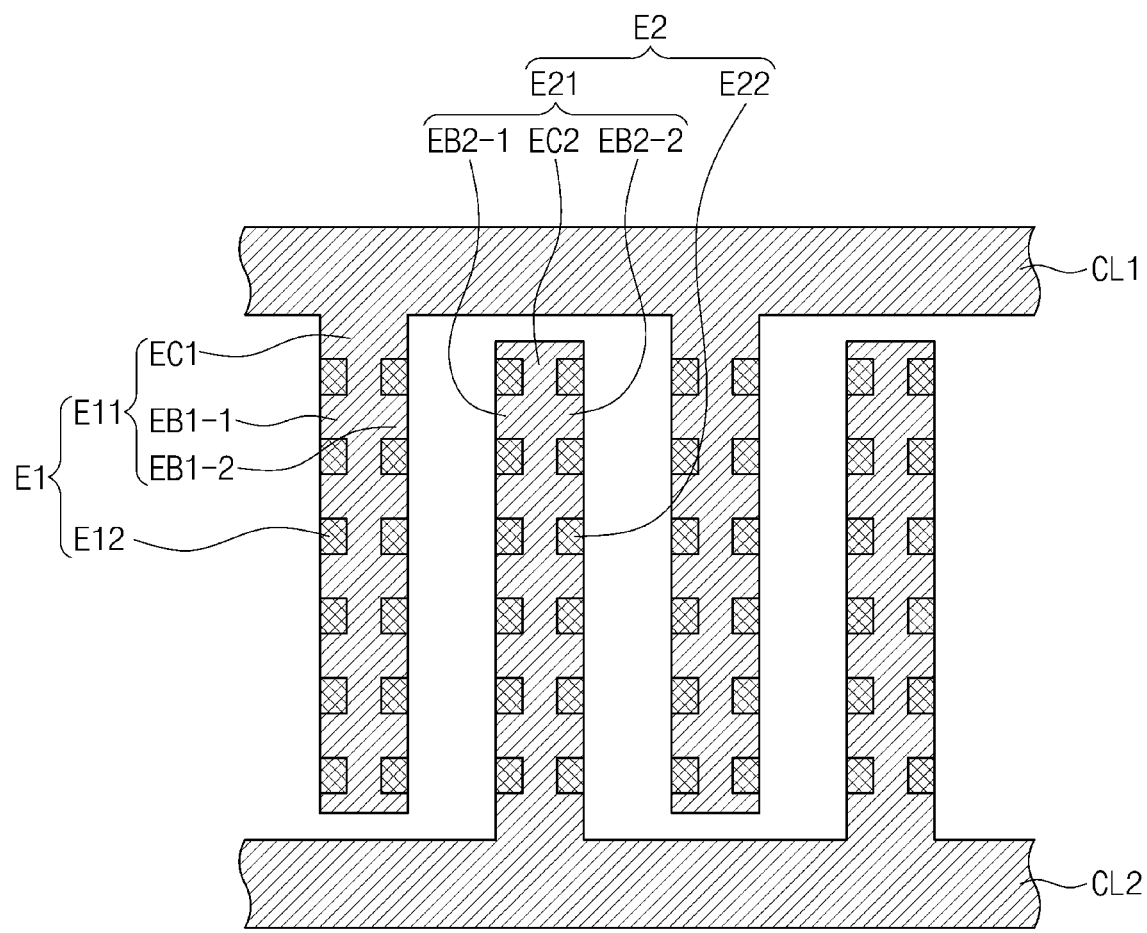
FIG. 6A is a plan view of an exemplary embodiment of some elements of a display panel constructed according to the principles of the invention.
Figure 6A:
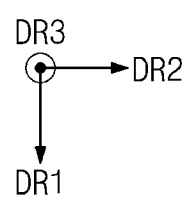
Figure 6B:
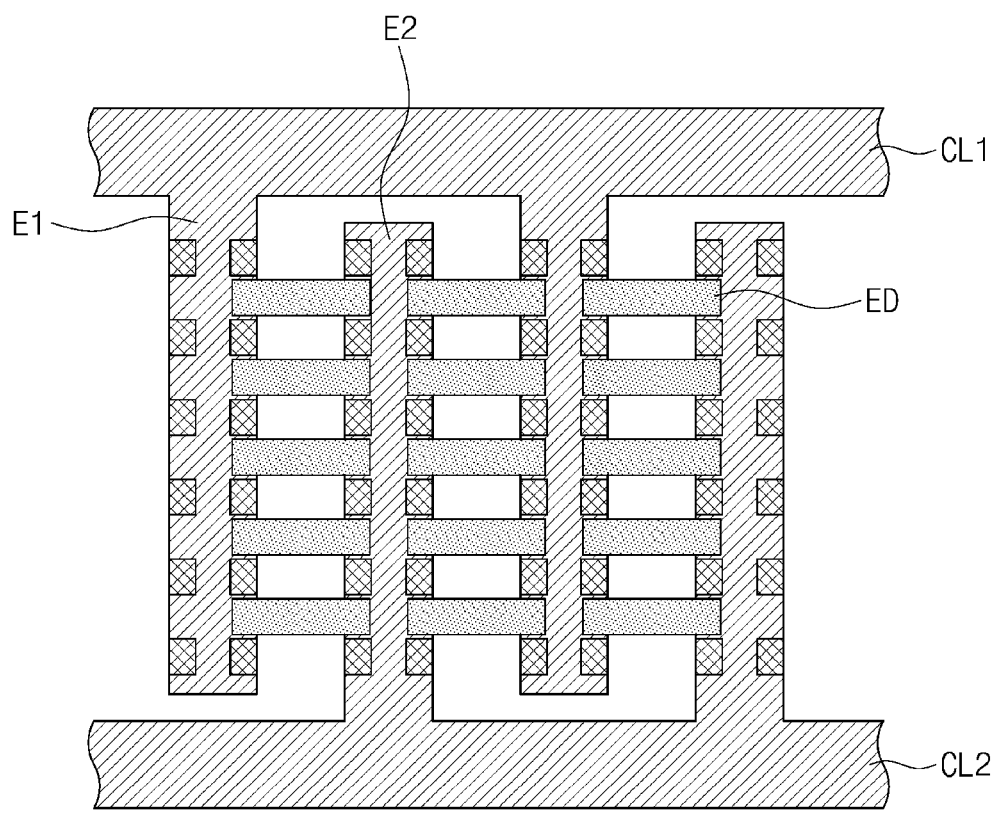
FIG. 6B is a plan view of another exemplary embodiment of some elements of a display panel constructed according to the principles of the invention.
Figure 6B:
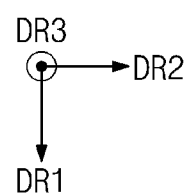

FIGS. 6A and 6B are plan views of exemplary embodiments of some elements of a display panel constructed according to the principles of the invention. In the description of FIGS. 6A and 6B, an element previously described with reference to FIGS. 1 to 5 may be identified by the same reference number without repeating a redundant description thereof. In FIGS. 6A and 6B, a region corresponding to one pixel is illustrated and some elements are omitted.

Referring to FIGS. 6A and 6B, a plurality of the first electrodes E1 and a plurality of the second electrodes E2 may be provided in one pixel region. FIGS. 6A and 6B illustrate example in which a pair of the first electrodes E1 and a pair of the second electrodes E2 are provided. For example, the first electrodes E1 may include two downwardly extending projections from a first connection line CL1 and the second electrodes E2 may also include two upwardly extending projections from a second connection line CL2 such that the downwardly and upwardly extending projections alternate in an interleaving manner, as shown in FIGS. 6A and 6B. However, the exemplary embodiments are not limited to example. For example, in an exemplary embodiment, one first electrode E1 and one second electrode E2 may be disposed in each pixel region, and in another exemplary embodiment, three or more first electrode E1 and three or more second electrode E2 may be disposed in each pixel region.

The first electrode E1 may be connected to a first connection line CL1, and the second electrode E2 may be connected to a second connection line CL2. The first connection line CL1 and the first electrode E1 may constitute a single member, and the second connection line CL2 and the second electrode E2 may constitute a single member.

The first connection line CL1 may electrically connect the first electrode E1 with the connection electrode CNE (e.g., see FIG. 5), and the second connection line CL2 may electrically connect the second electrode E2 with the second power line PL2 (e.g., see FIG. 3).

The first electrode E1 may include a first region E11 and second regions E12. The first region E11 may have a first electrical resistance. The second regions E12 may have a second electrical resistance higher than the first resistance. The first region E11 may include a first electrode center region EC1, which extends in the first direction DR1, and first electrode protrusion regions EB1-1 and EB1-2, which protrude from the first electrode center region EC1 in the second direction DR2. For example, the first electrode center region EC1 may be disposed on the first partition wall BR1 (e.g., see FIG. 5). Each of the first electrode protrusion regions EB1-1 and EB1-2 may include first protrusion regions EB1-1 and second protrusion regions EB1-2. When viewed in a plan view, the first electrode center region EC1 may be disposed between the first protrusion regions EB1-1 and the second protrusion regions EB1-2. For example, referring to the exemplary embodiment of FIG. 6A, the first protrusion regions EB1-1 may be located in the left side of the first electrode center region EC1, and the second protrusion regions EB1-2 may be located in the right side of the first electrode center region EC1.

A plurality of the second regions E12 may be arranged to be spaced apart from each other in the first direction DR1. For example, the first electrode protrusion regions EB1-1 and EB1-2 of the first region E11 and the plurality of the second regions E12 may be alternately arranged in the first direction DR1. Each of the second regions E12 may be a treated to form a region with an electrical resistance that differs from the surrounding non-treated portions. For example, each of the second regions E12 may be an ion injection region or an amorphous region.

The second regions E12 may be a region, in which oxygen ions ($O^+$) are injected. However, the exemplary embodiments are not limited to example, and in an exemplary embodiment, ions, which are different from the oxygen ions, may be injected into the second regions E12. The amount of oxygen ions ($O^+$) contained in the second regions E12 may be greater than an amount of oxygen ions ($O^+$) contained in the first region E11. For example, the first region E11 may include indium tin oxide (ITO), and the second regions E12 may include indium tin oxide (ITO) doped with oxygen ions. However, the exemplary embodiments are not limited to example. For example, the first region E11 may include aluminum (Al), and the second regions E12 may include aluminum oxide ($Al_xO_x$). Since the second regions E12 are doped with the oxygen ions, the second regions E12 may have electrical resistance higher than that of the first region E11.

Each of the second regions E12 may be an amorphous region, which is physically treated by ions, atoms, plasma or the like. For example, the second regions E12 may include a portion made of amorphous indium tin oxide (ITO). However, the exemplary embodiments are not limited to example. For example, the second regions E12 may include a portion made of amorphous aluminum (Al). In the case where the second regions E12 have an amorphous structure, the second regions E12 may have electric resistance higher than that of the first region E11.

The second electrode E2 may include a third region E21 and fourth regions E22. The third region E21 may have a third resistance. The fourth regions E22 may have a fourth resistance higher than the third resistance. The third region E21 may include a second electrode center region EC2, which extends in the first direction DR1, and second electrode protrusion regions EB2-1 and EB2-2, which protrude from the second electrode center region EC2 in the second direction DR2. For example, the second electrode center region EC2 may be disposed on the second partition wall BR2 (e.g., see FIG. 5). The second electrode protrusion regions EB2-1 and EB2-2 may include third protrusion regions EB2-1 and a fourth protrusion regions EB2-2. When viewed in a plan view, the second electrode center region EC2 may be disposed between the third protrusion regions EB2-1 and the fourth protrusion regions EB2-2. For example, referring to the exemplary embodiment of FIG. 6A, the third protrusion regions EB2-1 may be located in the left side of the second electrode center region EC2, and the fourth protrusion regions EB2-2 may be located in the right side of the second electrode center region EC2.

A plurality of the fourth regions E22 may be arranged to be spaced apart from each other in the first direction DR1. For example, the second electrode protrusion regions EB2-1 and EB2-2 of the third region E21 and the plurality of the fourth regions E22 may be alternately arranged in the first direction DR1.

The third region E21 and the fourth regions E22 of the second electrode E2 may have the same structure as the first region E11 and the second regions E12 of the first electrode E1. Thus, a detailed description thereof will be omitted to avoid redundancy.

The first electrode E1 and the second electrode E2 may be spaced apart from each other. For example, the first electrode E1 and the second electrode E2 may be alternately arranged in the second direction DR2.

FIG. 6B is a plan view illustrating the first electrode E1, the second electrode E2, and the light-emitting element ED, which is electrically connected to the first electrode E1 and the second electrode E2. When viewed in a plan view, the light-emitting element ED may be overlapped with the first region E11 of the first electrode E1 and the third region E21 of the second electrode E2. For example, the light-emitting element ED may be overlapped with the second protrusion regions EB1-2 of the first electrode E1 and the third protrusion regions EB2-1 of the second electrode E2. However, the exemplary embodiments are not limited to example. According to an exemplary embodiment, an arrangement position of the light-emitting element ED may be controlled by the first electrode E1 and the second electrode E2, whose resistance is different from region to region. Thus, it may be possible to improve a fabrication yield and reliability of the display device DD (e.g., see FIG. 1). To be specific, due to a difference in electrical resistance between the first electrode E1 and the second electrode E2, the strength of an electric field between the second regions E12 and the fourth regions E22 shown in FIG. 6A may be weaker than the strength of an electric field between the first region E11 and the third region E21 shown in FIG. 6A. Accordingly, the light-emitting elements ED are automatically aligned in the first region E11 of the first electrode E1 and the third region E21 of the second electrode E2, when viewed in a plan view, due to the differential electric fields.

Figure 7A:
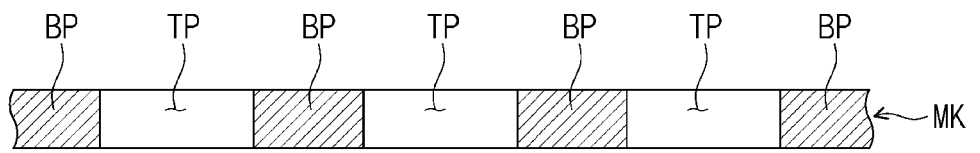
FIG. 7A is a diagram illustrating an exemplary embodiment of first step of forming first region and second regions of a first electrode according to the principles of the invention.
Figure 7A:
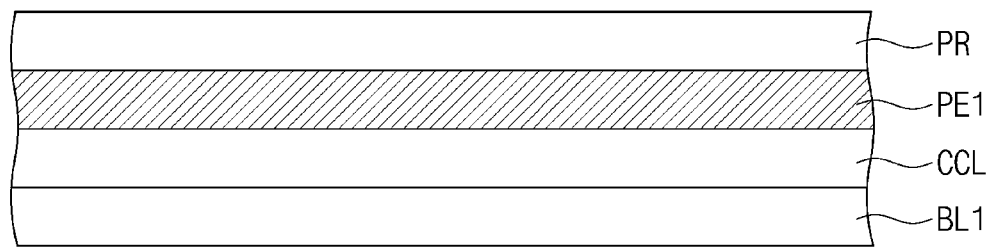
Figure 7A:
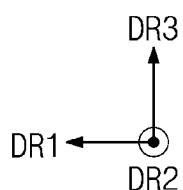
Figure 7B:
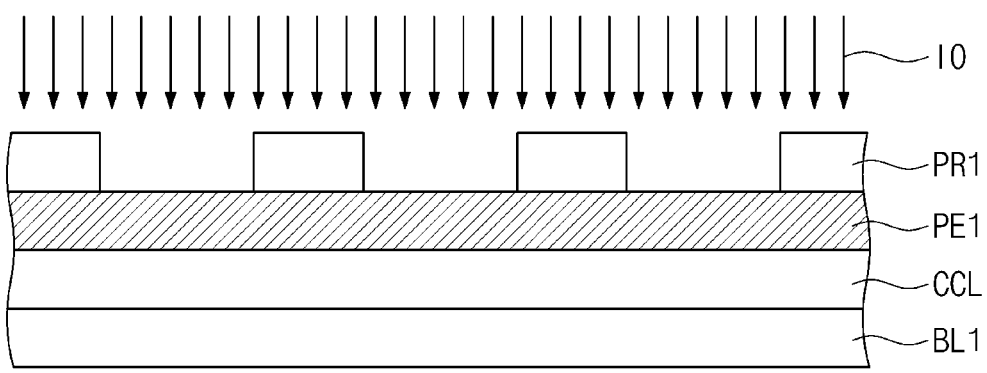
FIG. 7B is a diagram illustrating an exemplary embodiment of second step of forming a first region and second regions of a first electrode.
Figure 7B:
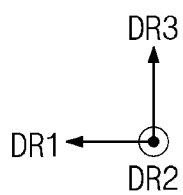
Figure 7C:
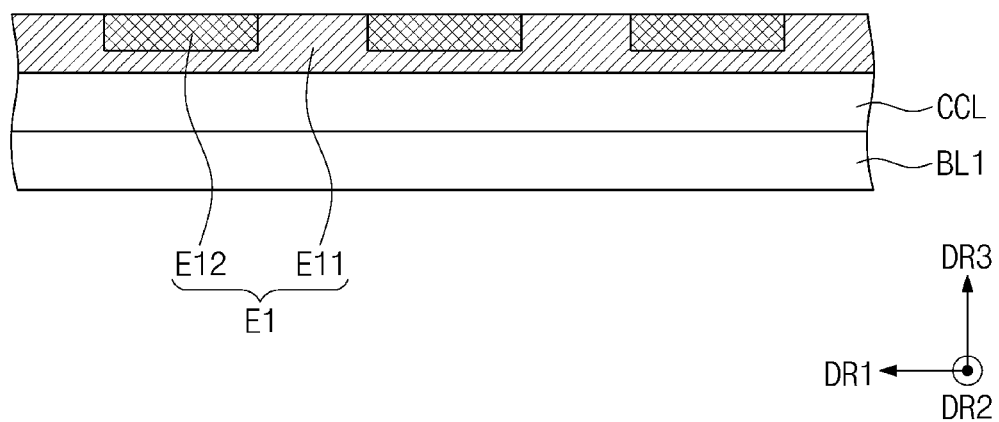
FIG. 7C is a diagram illustrating an exemplary embodiment of third step of forming a first region and second regions of a first electrode.

FIGS. 7A to 7C are diagrams, each of which illustrates an exemplary embodiment of first to third steps of forming a first region and second regions of a first electrode according to the principles of the invention. An element previously described with reference to FIGS. 1 to 6B may be identified by the same reference number without repeating a redundant description thereof.

Referring to FIG. 7A, the circuit layer CCL may be formed on the first base layer BL1. The circuit layer CCL may include a stacking structure including a plurality of insulating layers, a plurality of transistors, and a plurality of electrodes. For example, referring to FIG. 5, the circuit layer CCL may include a buffer layer BFL, a first insulating layer L1, the first thin film transistor TR1, the second thin film transistor TR2, a second insulating layer L2, a third insulating layer L3, a fourth insulating layer L4, a connection electrode CNE, and a fifth insulating layer L5. A first preliminary electrode PE1 and second preliminary electrode may be formed on the circuit layer CCL. During a fabrication process, the first base layer BL1 may be disposed on a working substrate. The working substrate may be removed, when the process of fabricating the display panel is finished.

A photoresist layer PR may be formed on the first preliminary electrode PE1. The photoresist layer PR may include an organic material. After the formation of the photoresist layer PR, a mask MK may be disposed on the photoresist layer PR. The mask MK may be a binary mask including a light transmission portion TP and a light-blocking portion BP.

The photoresist layer PR may be a positive photoresist layer or a negative photoresist layer. Hereinafter, a case in which the photoresist layer PR is the positive photoresist layer will be described as an example.

When viewed in a plan view, the light transmission portion TP may be overlapped with a region, on which the second regions E12 of the first electrode E1 (e.g., see FIG. 6A) will be formed. The light-blocking portion BP may be overlapped with a region other than the second regions E12 of the first electrode E1, in a plan view. The mask MK may be disposed on the photoresist layer PR, and light may be irradiated onto the photoresist layer PR.

Referring to FIG. 7B, the photoresist layer PR may be patterned to form a photoresist pattern PR1. For example, the patterning of the photoresist layer PR may include an exposure process and a develop process. After the formation of the photoresist pattern PR1, a process of causing damage in a region of the first preliminary electrode PE1 may be performed to form the first electrode E1 (e.g., see FIG. 6A). The resistance treatment process may include an ion injection step of providing ions IO into the first preliminary electrode PE1. For example, the ions IO may be, for example, oxygen ions ($O^+$). However, the exemplary embodiments are not limited to example, and various other ions may be used instead of the ions IO.

The resistance treatment process may include providing atoms or plasma to the first preliminary electrode PE1. The atoms may be, for example, argon or nitrogen atoms.

Referring to FIG. 7C, the photoresist pattern PR1 (e.g., see FIG. 7B) may be removed by a photoresist delamination process. The second regions E12 may be an amorphous region, which is treated by ions, atoms, or plasma. For example, the second regions E12 may include amorphous indium tin oxide (ITO). However, the exemplary embodiments are not limited to example. For example, the second regions E12 may include amorphous aluminum (Al). In the case where the second regions E12 have an amorphous structure, the second regions E12 may have electric resistance higher than that of the first region E11.

The amount of oxygen ions ($O^+$) contained in the second regions E12 may be greater than an amount of oxygen ions ($O^+$) contained in the first region E11. For example, the first region E11 may include indium tin oxide (ITO), and the second regions E12 may include indium tin oxide (ITO) doped with oxygen ions. However, the exemplary embodiments are not limited to example. For example, the first region E11 may include aluminum (Al), and the second regions E12 may include aluminum oxide ($Al_xO_x$). The second regions E12 doped with the oxygen ion ($O^+$) may have electric resistance higher than that of the first region E11. The second regions E12 may have electrical resistance higher than that of the first region E11.

The third region E21 and the fourth regions E22 of the second electrode E2 shown in FIG. 6A may be formed by the same process as that for the first region E11 and the second regions E12 of the first electrode E1. Thus, a detailed description of the second preliminary electrode and the second electrode E2 is omitted to avoid redundancy.

Figure 8:
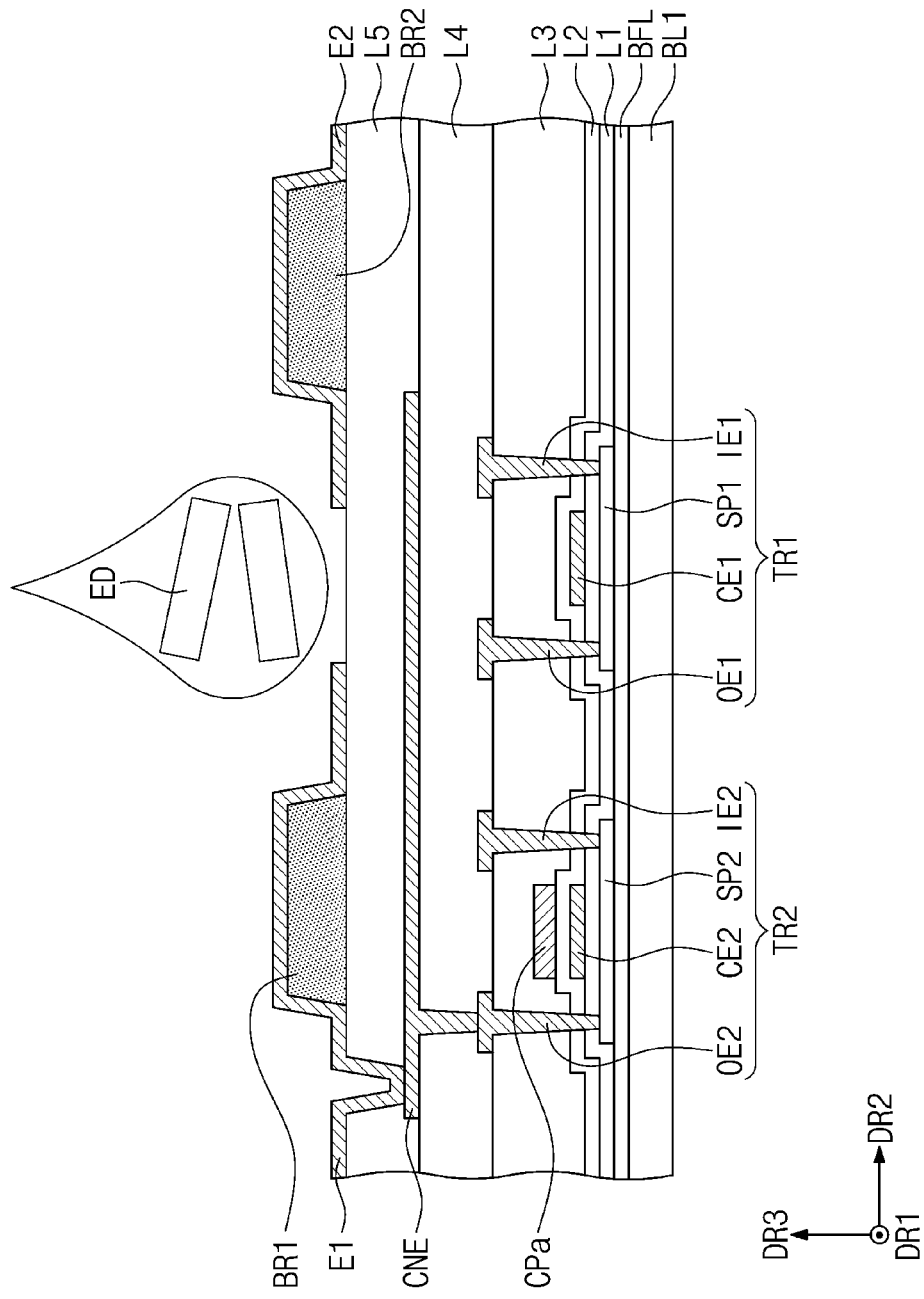
FIG. 8 is a sectional view illustrating an exemplary embodiment of a step of providing a light-emitting element constructed according to the principles of the invention.

FIG. 8 is a sectional view illustrating an exemplary embodiment of a step of providing a light-emitting element constructed according to the principles of the invention. An element previously described with reference to FIGS. 1 to 7C may be identified by the same reference number without repeating a redundant description thereof.

Referring to FIG. 8, a solution, in which the light-emitting element ED and solvent are contained, may be provided on the first electrode E1 and the second electrode E2. The solvent may be a material that can be evaporated in a room temperature or by heat. The solution may be an ink containing the light-emitting element ED or a paste material containing the light-emitting element ED. An electric field may be produced between the first electrode E1 and the second electrode E2 by applying power to the first electrode E1 and the second electrode E2. The electric field may induce a dipole moment in the light-emitting element ED, and in this case, the light-emitting element ED may be aligned between the first electrode E1 and the second electrode E2 by a dielectrophoresis force. The step of providing of the light-emitting element ED may further include evaporating the solvent, after the alignment of the light-emitting element ED.

According to an exemplary embodiment, owing to a different in electrical resistance, the strength of an electric field between the second regions E12 and the fourth regions E22 (e.g., see FIG. 6B) may be weaker than a strength of an electric field between the first region E11 and the third region E21 (e.g., see FIG. 6B). Thus, the light-emitting element ED may be automatically and easily aligned in the first region E11 of the first electrode E1 and the third region E21 of the second electrode E2, when viewed in a plan view. Accordingly, the aligned light-emitting element ED may be overlapped with the second protrusion regions EB1-2 (e.g., see FIG. 6B) of the first electrode E1 and with the first protrusion regions EB2-1 (e.g., see FIG. 6B) of the second electrode E2. According to an exemplary embodiment, an arrangement position of the light-emitting element ED may be controlled by using a spatial variation in electrical resistance of the electrode. Thus, it may be possible to improve a fabrication yield and reliability of the display device DD (e.g., see FIG. 1).

According to an exemplary embodiment, a first electrode may include a first region and a second region, which have a first resistance and a second resistance, respectively, and a second electrode may include a third region and a fourth resistance, which have a third resistance and a fourth region. Here, the second and fourth resistances may be higher than the first and third resistances, respectively, and a difference of such a resistance may be used to control an arrangement position of the light-emitting element. Thus, it may be possible to improve a fabrication yield and reliability of a display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a substrate;
    a first electrode disposed on the substrate;
    a second electrode disposed on the substrate and spaced apart from the first electrode; and
    a light-emitting element disposed on the first electrode and the second electrode,
    wherein the first electrode comprises a first portion on which the light emitting element is disposed, and a second portion on which the light emitting element is not disposed,
    the second electrode comprising a third portion on which the light emitting element is disposed, and a fourth portion on which the light emitting element is not disposed, and
    each of the second portion and the fourth portion comprises an electrode center portion, and a plurality of amorphous portions disposed beside the electrode center portion, and
    each of the first portion and the third portion is disposed between the amorphous portions.

2. The display device of claim 1, wherein the amorphous portion of the first electrode and the second electrode has a first resistance higher than a second resistance of the first portion and the third portion.

3. The display device of claim 2, wherein the electrode center portion of the second portion and the fourth portion has the second resistance.

4. The display device of claim 1, further comprises:
    a first connection electrode disposed on the first electrode and contact with the light emitting element; and
    a second connection electrode disposed on the second electrode and contact with the light emitting element.

5. The display device of claim 4, further comprises an insulating pattern disposed on the light emitting elements,
    wherein at least portion of the first connection electrode and the second connection electrode is contact with the insulating pattern.

6. The display device of claim 4, further comprises a pixel circuit disposed between the substrate and the first and second electrodes,
    wherein the first connection electrode and the second connection electrode are electrically contact with the pixel circuit.

7. The display device of claim 6, further comprises a first insulating layer disposed between the pixel circuit and the first and second electrodes.

8. The display device of claim 6, wherein the first electrode is contact with a third connection electrode of the pixel circuit disposed under the first insulating layer.

9. The display device of claim 1, further comprises:
    a first wall disposed between the first electrode and the substrate; and
    a second wall disposed between the second electrode and the substrate,
    wherein each of the electrode center portions of the second portion and the fourth portion is overlapping with the first wall and the second wall, respectively.

10. The display device of claim 9, wherein the light-emitting element is disposed between the first wall and the second wall.

11. The display device of claim 1, further comprises:
    a second insulating layer disposed on the first electrode and the second electrode;
    a light-blocking layer disposed on the second insulating layer and surrounding an opening on the second insulating layer; and
    a wavelength converter disposed at the opening and comprising a resin and a light emitter dispersed in the resin.

12. The display device of claim 11, wherein the light emitting element is overlapping with the wavelength converter.

13. The display device of claim 11, further comprises a third insulating layer disposed between the second insulating layer and the first and second electrodes.

14. A display device, comprising:
    a first electrode extending in a first direction;
    a second electrode extending in the first direction and spaced apart from the first electrode in a second direction; and
    a plurality of light-emitting elements disposed on the first electrode and the second electrode and arranged in the first direction,
    wherein the first electrode comprises a plurality of first portions spaced apart from each other in the first direction and a plurality of second portions disposed between the first portions,
    the second electrode comprises a plurality of third portions spaced apart from each other in the first direction and a plurality of fourth portions disposed between the third portions,
    both ends of the light emitting element are disposed on the first portion and third portion, and the second portion and the fourth portion are amorphous region.

15. The display device of claim 14, wherein the second portion and the fourth portion have a first resistance higher than a second resistance of the first portion and third portion.

16. The display device of claim 14, further comprises:
a first electrode layer extending in the second direction; and
a second electrode layer extending in the second direction and spaced apart from the first electrode layer in the first direction,
wherein the plurality of light-emitting element is disposed between the first electrode layer and the second electrode layer.

17. The display device of claim 16, wherein the first electrode is electrically contact with the first electrode layer, and
the second electrode is electrically contact with the second electrode layer.

18. The display device of claim 14, further comprises:
a first connection electrode disposed on the first electrode and contact with the plurality of the light-emitting element; and
a second connection electrode disposed on the second electrode and contact with the plurality of the light-emitting element.

19. The display device of claim 14, wherein
the first electrode comprises a first electrode center portion extending in the first electrode,
the second electrode comprises a second electrode center portion extending in the first electrode,
the first portion and the second portion are disposed beside the first electrode center portion, and
the third portion and the fourth portion are disposed beside the second electrode center portion.

20. The display device of claim 19, further comprises:
a first wall overlapping with the first electrode center portion; and
a second wall overlapping with the second electrode center portion,
wherein the plurality of light-emitting element is disposed between the first wall and the second wall.

* * * * *